(12) United States Patent
Satou et al.

(10) Patent No.: US 12,145,665 B2
(45) Date of Patent: Nov. 19, 2024

(54) STEER-BY-WIRE STEERING SYSTEM

(71) Applicant: TOYOTA JIDOSHA KABUSHIKI KAISHA, Toyota (JP)

(72) Inventors: Atsushi Satou, Miyoshi (JP); Yosuke Yamashita, Nagoya (JP); Hiroaki Hanzawa, Toyota (JP); Kazuaki Iida, Toyota (JP); Tokuaki Hibino, Osaka (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 226 days.

(21) Appl. No.: 17/873,652

(22) Filed: Jul. 26, 2022

(65) Prior Publication Data
US 2023/0029564 A1   Feb. 2, 2023

(30) Foreign Application Priority Data
Jul. 28, 2021   (JP) .................. 2021-122982

(51) Int. Cl.
*B62D 5/04* (2006.01)
*B60R 16/033* (2006.01)
*G01R 19/165* (2006.01)

(52) U.S. Cl.
CPC .......... *B62D 5/0484* (2013.01); *B60R 16/033* (2013.01); *G01R 19/16528* (2013.01)

(58) Field of Classification Search
CPC ............... B62D 5/0481; B62D 5/0484; G01R 19/16528; G01R 19/16542; B60R 16/033
See application file for complete search history.

(56) References Cited

U.S. PATENT DOCUMENTS

| | | | | |
|---|---|---|---|---|
| 7,130,728 B2* | 10/2006 | Suzuki | .................. | B62D 6/008 |
| | | | | 180/413 |
| 9,174,667 B2* | 11/2015 | Suzuki | ................ | B62D 5/0484 |
| 2011/0066331 A1* | 3/2011 | Yamashita | ........... | B62D 5/0481 |
| | | | | 701/42 |
| 2011/0297473 A1* | 12/2011 | Krahn | .................... | B62D 5/091 |
| | | | | 180/422 |
| 2013/0253766 A1* | 9/2013 | Kimura | ................ | B62D 5/0463 |
| | | | | 701/41 |

(Continued)

FOREIGN PATENT DOCUMENTS

JP   2004-338657 A   12/2004

*Primary Examiner* — Babar Sarwar
(74) *Attorney, Agent, or Firm* — Sughrue Mion, PLLC

(57) ABSTRACT

A steer-by-wire steering system includes: a steering device including a steering motor powered by a main power source and/or a backup power source; and a controller configured to control the steering device based on a steering request. When the backup power source is normal, the controller executes an abnormal-situation control based on electric power supplied to the steering motor by the main power source and/or the backup power source when the controller determines that the voltage of the main power source is less than a first threshold. When the backup power source is abnormal, the controller executes the abnormal-situation control based on electric power supplied to the steering motor by the main power source when the controller determines that the voltage of the main power source is less than a second threshold that is greater than the first threshold.

5 Claims, 4 Drawing Sheets

(56) References Cited

U.S. PATENT DOCUMENTS

| | | | |
|---|---|---|---|
| 2015/0246683 A1* | 9/2015 | Kuramochi | B62D 5/003 |
| | | | 701/43 |
| 2015/0249406 A1* | 9/2015 | Koseki | H02M 7/5387 |
| | | | 318/400.27 |
| 2016/0075370 A1* | 3/2016 | Itamoto | B62D 5/0466 |
| | | | 701/41 |
| 2016/0200355 A1* | 7/2016 | Mori | H02P 21/22 |
| | | | 180/446 |
| 2016/0229445 A1* | 8/2016 | Sasaki | B62D 5/0484 |
| 2016/0339949 A1* | 11/2016 | Mori | H02P 29/032 |
| 2018/0079448 A1* | 3/2018 | Kodera | B62D 6/008 |
| 2020/0269913 A1* | 8/2020 | Fujimoto | B62D 5/0484 |
| 2022/0255343 A1* | 8/2022 | Mitani | H02J 7/0063 |

\* cited by examiner

IN NORMAL STATE OF BACKUP POWER SOURCE

IN ABNORMAL STATE BACKUP POWER SOURCE

STEER-BY-WIRE STEERING SYSTEM

CROSS REFERENCE TO RELATED APPLICATION

The present application claims priority to Japanese Patent Application No. 2021-122982, which was filed on Jul. 28, 2021, the disclosure of which is herein incorporated by reference in its entirety.

BACKGROUND

Technical Field

The following disclosure relates to a steer-by-wire steering system for vehicles.

Description of Related Art

From the viewpoint of failsafe, it has been proposed to provide a steer-by-wire steering system with a backup power source or to provide the steering system with redundancy. For instance, Patent Document 1 (Japanese Patent Application Publication No. 2004-338657) discloses a vehicle steering device configured such that a power supply source, by which a steering shaft drive motor is powered, is switched from a main power source to a backup power source when the voltage of the main power source is lowered.

SUMMARY

The Patent Document 1 indicated above does not describe any particular measures to deal with a situation in which the voltage of the main power source is gradually decreasing due to a failure or an abnormality of the main power source after the backup power source has become abnormal. An aspect of the present disclosure is directed to a steering system capable of executing an abnormal-situation control even if the main power source becomes abnormal in a state in which the backup power source is abnormal.

In one aspect of the present disclosure, a steer-by-wire steering system includes: a main power source and a backup power source; a steering device including a steering motor configured to be powered by at least one of the main power source and the backup power source, the steering device being configured to steer at least one wheel by a force generated by the steering motor; and a controller configured to detect a voltage of the main power source, cause the main power source to power the steering motor, and control the steering device based on a steering request. When the backup power source is normal, the controller executes an abnormal-situation control based on electric power supplied to the steering motor by at least one of the main power source and the backup power source when the controller determines that the voltage of the main power source is less than a first threshold. When the backup power source is abnormal, the controller executes the abnormal-situation control based on electric power supplied to the steering motor by the main power source when the controller determines that the voltage of the main power source is less than a second threshold that is greater than the first threshold.

In the steer-by-wire steering system according to the present disclosure, the second threshold is greater, namely, higher, than the first threshold. Thus, timing of starting to execute the abnormal-situation control is earlier when the voltage of the main power source is lowered in a situation in which the backup power source is abnormal than when the voltage of the main power source is lowered in a situation in which the backup power source is normal. With this configuration, under circumstances where the backup power source fails to supply electric power, the abnormal-situation control can be started before the voltage of the main power source is lowered to a level where the abnormal-situation control is not executable. In the present steering system, the abnormal-situation control can be started at earlier timing, in other words, the abnormal-situation control can be started in a state in which the voltage of the main power source is still high, so that a time for executing the abnormal-situation control is sufficiently ensured. Thus, the present steering system enables the abnormal-situation control to be executed even if the main power source becomes abnormal in the situation in which the backup power source is abnormal.

BRIEF DESCRIPTION OF THE DRAWINGS

The objects, features, advantages, and technical and industrial significance of the present disclosure will be better understood by reading the following detailed description of an embodiment, when considered in connection with the accompanying drawings, in which.

DETAILED DESCRIPTION OF THE EMBODIMENT

Figure 1:
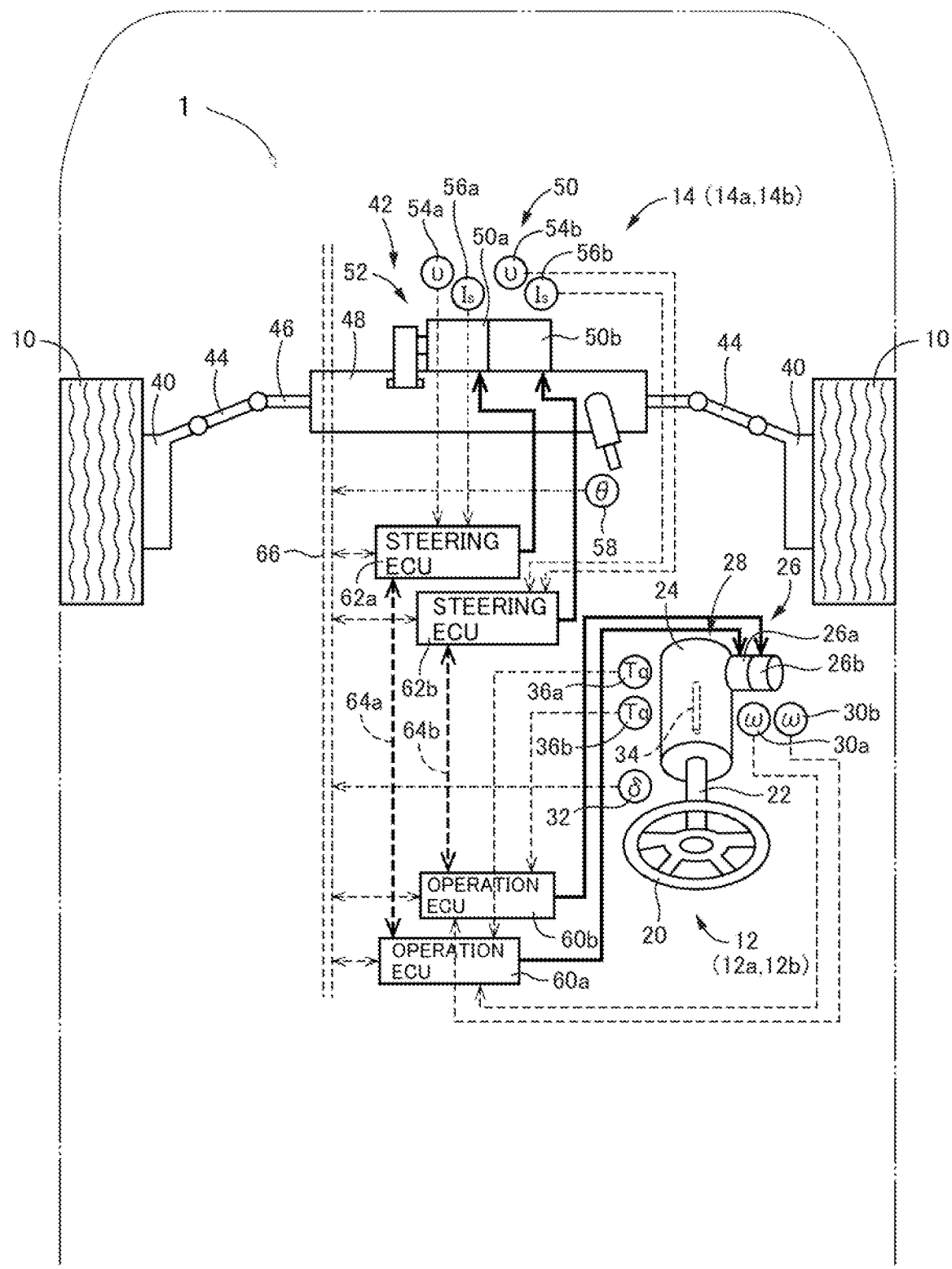
FIG. 1 is a view schematically illustrating an overall configuration of a steering system according to one embodiment.

Referring to the drawings, there will be described below in detail a steering system according to one embodiment of the present disclosure. There will be first described a configuration and a control of the steering system (A-C) and subsequently a detailed configuration of a backup power source (D) and an abnormal-situation control (E). It is to be understood that the present disclosure is not limited to the details of the following embodiment but may be embodied based on the forms described in Various Forms and may be changed and modified based on the knowledge of those skilled in the art.

A. Configuration of Steering System

As schematically illustrated in FIG. 1, a steering system 1 according to one embodiment is installed on a vehicle for steering two wheels 10, i.e., front wheels 10, each of which is a steerable wheel. The present steering system 1 is a steer-by-wire steering system including an operation device 12 and a steering device 14, which are mechanically independent of each other.

The operation device 12 includes a steering wheel 20, a steering shaft 22, a steering column 24, and a reaction force applying mechanism 28. The steering wheel 20 is an operation member operable by a driver of the vehicle to steer the wheels 10. The steering shaft 22 is a shaft member to one end of which is attached the steering wheel 20. The steering column 24 is a member rotatably holding the steering shaft 22 and supported by an instrument panel reinforcement (not illustrated). The reaction force applying mechanism 28 is configured to apply, to the steering wheel 20 via the steering shaft 22, a reaction force against a steering operation of the steering wheel 20 by utilizing, as a force generation source, a reaction force motor 26 supported by the steering column 24. The reaction force motor 26 is an electric motor. Though the reaction force is a reaction force torque in a strict sense, a commonly used term "operation reaction force" will be hereinafter used. The reaction force applying mechanism 28 has an ordinary configuration including a speed reducer, etc., and a detailed description of the reaction force applying mechanism 28 is dispensed with.

The reaction force motor 26 is a three-phase brushless DC motor. Magnets are fixed to an outer circumference of a rotational shaft of the reaction force motor 26, and coils are provided on the motor housing so as to be opposed to the magnets. The reaction force motor 26 is a dual-system motor in which two sets of coils are provided for one magnet. Hereinafter, one and the other of the two systems of the reaction force motor 26 will be respectively referred to as "reaction force motor 26a" and "reaction force motor 26b" where appropriate. The reaction force motor 26a includes a motor rotation angle sensor 30a for detecting a rotation angle in one rotation (that may be considered as "relative angle" or "phase") for phase switching in power supply to the reaction force motor 26a. Similarly, the reaction force motor 26b includes a motor rotation angle sensor 30b. Hereinafter, a term "motor rotation angle sensor 30" will be used as a general term for the motor rotation angle sensors 30a, 30b where appropriate. In the present embodiment, the operation device 12 is a redundant system including two systems, i.e., an operation device 12a and an operation device 12b.

The operation device 12 includes an operation angle sensor 32 for detecting an operation angle of the steering wheel 20 as a steering operation amount. Here, a posture of the steering wheel 20 in a straight driving state of the vehicle is defined as a neutral posture. In this case, a rotation angle from the neutral posture in a rightward direction or a leftward direction (that may be considered as an absolute angle) is the operation angle of the steering wheel 20.

In the steering system 1, a torsion bar 34 is incorporated in the steering shaft 22, as in typical power steering systems. The steering system 1 includes operation torque sensors 36a, 36b for detecting an operation torque which is an operation force applied to the steering wheel 20 by the vehicle driver, based on a torsional amount of the torsion bar 34. Hereinafter, a term "operation torque sensor 36" is used as a general term for the operation torque sensors 36a, 36b where appropriate. The two operation torque sensors 36a, 36b are provided so as to correspond to the two systems of the operation device 12.

The wheels 10 are supported by a body of the vehicle via respective steering knuckles 40 such that the wheels 10 are turnable or steerable. The steering knuckles 40 are constituent elements of respective suspension devices. The steering device 14 rotates the steering knuckles 40 to thereby steer the wheels 10 together. The steering device 14 includes a steering actuator 42 as a main constituent element.

The steering actuator 42 includes a steering rod 46, a housing 48, and a rod moving mechanism 52. The steering rod 46, which may also be referred to as a rack bar, has opposite ends coupled to the right and left steering knuckles 40 via respective link rods 44. The housing 48 is fixedly supported by the vehicle body and supports the steering rod 46 such that the steering rod 46 is movable in the right-left direction. The rod moving mechanism 52 is configured to move the steering rod 46 in the right-left direction utilizing a steering motor 50 as a drive source. The steering motor 50 is an electric motor. The rod moving mechanism 52 is constituted principally by a ball screw mechanism including a ball groove formed in the steering rod 46 and a nut that is in engagement with the ball groove via the bearing balls and that is rotated by the steering motor 50. The rod moving mechanism 52 has an ordinary configuration, and a detailed description of the rod moving mechanism 52 is dispensed with.

Like the reaction force motor 26, the steering motor 50 is a dual-system, three-phase brushless DC motor including two systems. Hereinafter, one and the other of the two systems will be respectively referred to as "steering motor 50a" and "steering motor 50b" where appropriate. The steering motor 50a includes a motor rotation angle sensor 54a for detecting a rotation angle in one rotation (that may be considered as "relative angle" or "phase") for phase switching in power supply to the steering motor 50a. Similarly, the steering motor 50b includes a motor rotation angle sensor 54b. Hereinafter, a term "motor rotation angle sensor 54" is used as a general term for the motor rotation angle sensors 54a, 54b where appropriate. In the present embodiment, the steering device 14 is a redundant system including two systems, i.e., a steering device 14a and a steering device 14b. The steering motors 50a, 50b respectively include current sensors 56a, 56b such that the motor and the sensor have one-to-one correspondence. Each of the current sensors 56a, 56b detects a current IS actually supplied to the corresponding steering motor 50a, 50b. Hereinafter, a term "current sensor 56" is used as a general term for the current sensors 56a, 56b where appropriate.

The steering device 14 includes a steering angle sensor 58 for detecting an amount of movement of the steering rod 46 in a rightward direction or a leftward direction from its neutral position (that is a position of the steering rod 46 in the straight driving state of the vehicle) to thereby detect a steering angle, which is a steering amount of the wheels 10.

Control of the operation device 12, specifically, control of the operation reaction force, namely, control of the reaction force motor 26 of the operation device 12, is executed by operation electronic control units 60a, 60b that correspond to the respective two systems of the operation device 12. Each operation electronic control unit (that will be hereinafter referred to as "operation ECU") 60a, 60b is an operation controller for a corresponding one of the two systems of the operation device 12. Hereinafter, a term "operation ECU 60" is used as a general term for the operation ECUs 60a, 60b where appropriate. The operation ECU 60 is constituted by a computer including a CPU, a ROM, a RAM, etc., and an inverter that is a driver (drive circuit) for the reaction force motor 26.

Similarly, control of the steering device 14, specifically, control of the steering angle, namely, control of the steering motor 50 of the steering device 14, is executed by steering electronic control units 62a, 62b that correspond to the respective two systems of the steering device 14. Each steering electronic control unit (that will be hereinafter referred to as "steering ECU") 62a, 62b is a steering controller for a corresponding one of the two systems of the steering device 14. Hereinafter, a term "steering ECU 62" is used as a general term for the steering ECUs 62a, 62b where appropriate. The steering ECU 62 is constituted by a computer including a CPU, a ROM, a RAM, etc., and an inverter that is a driver (drive circuit) for the steering motor 50.

In the present embodiment, the operation device 12a, the steering device 14a, the operation ECU 60a, and the steering ECU 62a constitute one system while the operation device 12b, the steering device 14b, the operation ECU 60b, and the steering ECU 62b constitute another system, so that the steering system 1 is a dual-system steering system. In this configuration, the operation device 12a and the steering device 14a are connected by a dedicated communication line 64a while the operation device 12b and the steering device 14b are connected by a dedicated communication line 64b. (Hereinafter, a term "dedicated communication line 64" is used as a general term for the dedicated communication lines 64a, 64b where appropriate). For enabling communication between the operation device 12 and the steering device 14 in mutually different systems, the operation devices 12 and the steering devices 14 are connected to a CAN (car area network or controllable area network) 66, which is a common communication line.

In the steering system 1, the operation device 12a, the steering device 14a, the operation ECU 60a, and the steering ECU 62a constitute a main system while the operation device 12b, the steering device 14b, the operation ECU 60b, and the steering ECU 62b constitute a sub system. The steering device 14a and the steering motor 50a may be respectively considered as a steering main system 14a and a steering main system 50a while the steering device 14b and the steering motor 50b may be respectively considered as a steering sub system 14b and a steering sub system 50b. Likewise, the operation device 12a and the reaction force motor 26a may be respectively considered as an operation main system 12a and a reaction force main system 26a while the operation device 12b and the reaction force motor 26b may be respectively considered as an operation sub system 12b and a reaction force sub system 26b. Further, the operation ECU 60a and the steering ECU 62a may be respectively considered as a control main system 60a and a control main system 62a while the operation ECU 60b and the steering ECU 62b may be respectively considered as a control sub system 60b and a control sub system 62b.

B. Power Sources in Steering System

Figure 2:
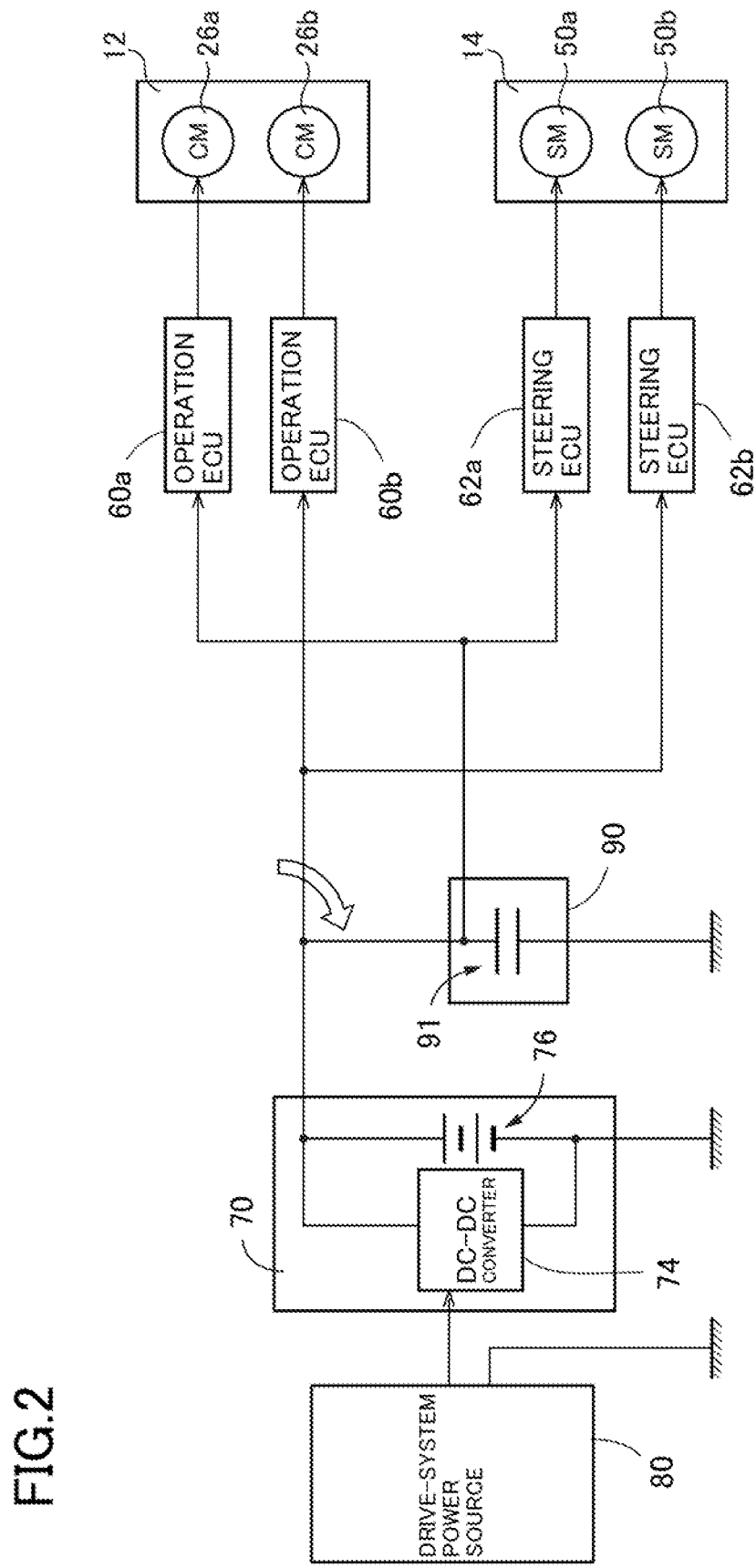
FIG. 2 is a schematic view illustrating a layout of power sources in the steering system.

As power sources for the operation device 12 and the steering device 14, the steering system 1 according to the present embodiment includes: a main power source unit 70, which is a main power source; and a backup power source unit 90, which is a backup power source, as schematically illustrated in FIG. 2. (Hereinafter, the main power source unit 70 and the backup power source unit 90 will be simply referred to as "main power source 70" and "backup power source 90", respectively.) The main power source 70 includes a DC-DC converter 74 and a storage battery 76. The storage battery 76 is referred to as an auxiliary battery. The backup power source 90 includes a capacitor 91, which is an electricity storage device. In FIG. 2, ground lines from the operation device 12 and the steering device 14 are not illustrated.

The vehicle on which the steering system 1 is installed is a hybrid electric vehicle (HEV). Electric power is supplied to the DC-DC converter 74 from a drive-system power source 80. The DC-DC converter 74 converts a voltage applied from the drive-system power source 80 to a drive voltage for the steering system 1. The storage battery 76 is parallelly connected to the DC-DC converter 74. The storage battery 76 stores electric energy at the voltage transformed by the DC-DC converter 74. In a case where the vehicle on which the steering system 1 is installed is neither hybrid electric vehicles (HEV) nor battery electric vehicles (BEV), the electric power may be supplied not from the drive-system power source 80 but from an alternator, for instance, or the main power source 70 may be configured to include the alternator.

The electric power is supplied to the reaction force motor 26b constituting the operation sub system 12b from the main power source 70 via the operation ECU 60b, and the electric power is supplied to the steering motor 50b constituting the steering sub system 14b from the main power source 70 via the steering ECU 62b. The electric power is supplied to the reaction force motor 26a constituting the operation main system 12a from the backup power source 90 via the operation ECU 60a, and the electric power is supplied to the steering motor 50a constituting the steering main system 14a from the backup power source 90 via the steering ECU 62a. As later described, in a normal power-supply situation in which normal power supply is conducted, the electric power is supplied to the reaction force motor 26a and the steering motor 50a from the main power source 70 via the backup power source 90.

The backup power source 90 receives the electric power from the main power source 70, and the capacitor 91 of the backup power source 90 is charged with the received electric power. The backup power source 90 allows the electric power received from the main power source 70 to pass therethrough while the capacitor 91 is charged, so as to allow the power supply from the main power source 70 to the reaction force motor 26a and the steering motor 50a. Thus, in the normal power-supply situation, the electric power is supplied from the main power source 70 to the reaction force motor 26a constituting the operation main system 12a and the steering motor 50a constituting the steering main system 14a. Further, in the normal power-supply situation, the electric power is supplied from the main power source 70 to the reaction force motor 26b constituting the operation sub system 12b and the steering motor 50b constituting the steering sub system 14b. Hereinafter, the power supply from the main power source 70 via the backup power source 90 will be referred to as power supply from the main power source 70 where appropriate.

A case is considered in which connection between the main power source 70 and the backup power source 90 is cut at a position indicated by the white arrow in FIG. 2, namely, a break occurs at the position, for instance. In this case, the main power source 70 cannot supply the electric power to the reaction force motor 26a and the steering motor 50a. Accordingly, the backup power source 90 supplies the electric power to the reaction force motor 26a and the steering motor 50a based on the electric energy stored in the capacitor 91. That is, the backup power source 90 supplies the electric power from the capacitor 91 in a case where the electric power is not supplied from the main power source 70 to the backup power source 90 at an appropriate voltage. Hereinafter, the power supply from the capacitor 91 will be referred to as power supply from the backup power source 90 where appropriate.

The steering system 1 according to the present embodiment is configured such that the electric power is supplied to the reaction force motor 26b constituting the operation sub system 12b and the steering motor 50b constituting the steering sub system 14b only from the main power source 70 and such that the electric power is supplied to the reaction force motor 26a constituting the operation main system 12a and the steering motor 50a constituting the steering main system 14a selectively from the main power source 70 and the backup power source 90. In a backup power-supply situation, a power supply source, by which the reaction force motor 26a and the steering motor 50a are powered, is switched from the main power source 70 to the backup power source 90, so that the reaction force motor 26a and the steering motor 50a are powered by the backup power source 90. The backup power source 90 will be later described in detail.

C. Control of Steering System

Hereinafter, there will be described the control of the steering system 1, namely, there will be described in order a steering control for the steering device 14 and a reaction force control for the reaction force applying mechanism 28 of the operation device 12.

(a) Steering Control

The steering control is for steering the wheels 10 in accordance with a steering request, namely, in accordance with the operation angle of the steering wheel 20 in manual driving. The steering control is executed by the steering ECU 62. As the steering control, two sorts of controls are set in the present steering system 1, i.e., an independent steering control (hereinafter simply referred to as "independent control" where appropriate) executed by the dual-system controller, namely, executed by the steering ECU 62a and the steering ECU 62b independently of each other and a coordinated steering control (hereinafter simply referred to as "coordinated control" where appropriate) executed by the steering ECU 62a and the steering ECU 62b in a coordinated fashion. The independent steering control and the coordinated steering control will be hereinafter explained.

i) Independent Steering Control

In the independent steering control, the steering ECU 62a controls the steering main system 14a, and the steering ECU 62b controls the steering sub system 14b. That is, the steering ECU 62a and the steering ECU 62b execute the same control in parallel with each other. Hereinafter, the steering control executed by the steering ECU 62a and the steering control executed by the steering ECU 62b will be described as the steering control executed by one system. In the following description of the independent steering control, the suffixes a, b used with the constituent elements will be omitted when it is not necessary to distinguish the main system and the sub system form each other.

The motor rotation angle of the reaction force motor 26 and the operation angle of the steering wheel 20 have a relation to satisfy a predetermined gear ratio. At startup of the vehicle, calibration of the motor rotation angle is carried out based on the operation angle detected by the operation angle sensor 32. The operation ECU 60 obtains the operation angle of the steering wheel 20 based on the motor rotation angle detected via the motor rotation angle sensor 30 of the reaction force motor 26. In the independent steering control, the steering ECU 62 receives information on the operation angle from the operation ECU 60 in the same system. The steering ECU 62 determines, based on the operation angle, a target steering angle that is a target of the steering angle of the wheels 10.

The steering ECU 62 determines, based on the determined target steering angle, a target motor rotation angle that is a target of the motor rotation angle of the steering motor 50. The steering ECU 62 detects an actual motor rotation angle of the steering motor 50 via the motor rotation angle sensor 54 and determines a motor rotation angle deviation that is a deviation of the motor rotation angle with respect to the target motor rotation angle. Here, the torque generated by the steering motor 50 is referred to as a steering torque. The steering ECU 62 determines the steering torque to be generated according to a feedback control law based on the motor rotation angle deviation.

Here, the current supplied to the steering motor 50 is referred to as a steering current. The steering torque and the steering current are generally proportional to each other. According to the relationship, the steering ECU 62 determines the steering current to be supplied to the steering motor 50 based on the determined steering torque and supplies the steering current to the steering motor 50. In this respect, the value of the steering current is utilized in the control for the reaction force applying mechanism 28 of the operation device 12 and in the coordinated steering control. Accordingly, the steering ECU 62 transmits information on the steering current.

ii) Coordinated Steering Control

The coordinated steering control is executed in the normal power-supply situation in which the electric power is suppliable from the main power source 70 both to the steering main system 14a and the steering sub system 14b. The coordinated steering control is for ensuring a smooth operation of the steering device 14, specifically, a smooth operation of the steering actuator 42, and for causing the steering main system 14a and the steering sub system 14b to generate mutually the same force. In other words, the coordinated steering control is for causing the steering motor 50b constituting the steering sub system 14b to operate in accordance with the steering motor 50a constituting the steering main system 14a.

In the coordinated steering control, the steering ECU 62a constituting the control main system transmits, to the steering ECU 62b constituting the control sub system, the information on the steering current that the steering ECU 62a itself supplies to the steering motor 50a. The steering ECU 62b does not determine the steering current that the steering ECU 62b itself supplies to the steering motor 50b, but supplies, to the steering motor 50b, the steering current based on the received information.

As described above, the steering system 1 according to the present embodiment includes: the main power source 70 and the backup power source 90; the steering device 14 including the dual-system steering motor 50 including the main system and the sub system and configured to steer the wheels 10 by the force generated by the steering motor 50; and the steering ECU 62 (as one example of a controller) configured to control the main system and the sub system of the steering motor 50 so as to control the steering device 14 based on the steering request. The steering system 1 is configured such that the electric power is supplied to the main system of the steering motor 50 selectively from the main power source 70 and the backup power source 90 and such that the electric power is supplied to the sub system of the steering motor 50 only from the main power source 70. In the normal power-supply situation in which the electric power is supplied from the main power source 70 to the main system and the sub system of the steering motor 50, the steering ECU 62 may cause the sub system of the steering motor 50 to operate in accordance with the main system of the steering motor 50. In the backup power-supply situation in which the electric power is supplied from the backup power source 90 to the main system of the steering motor 50, the steering ECU 62 may cause the main system of the steering motor 50 and the sub system of the steering motor 50 to operate independently of each other.

(b) Reaction Force Control

The reaction force control is for giving, to the vehicle driver, an operation feeling with respect to the steering operation. In the present steering system 1, the reaction force control is configured such that, in the normal power-supply situation, the operation main system 12a and the operation sub system 12b apply the same operation reaction force to the steering wheel 20 independently of and in parallel to each other. There will be hereinafter described a reaction force application process executed in the reaction force control by each of the operation ECU 60a constituting the control main system and the operation ECU 60b constituting the control sub system. Since the reaction force application process executed by the operation ECU 60a and the reaction force application process executed by the operation ECU 60b are substantially identical to each other, the following description will be made focusing on one reaction force application process.

The operation ECU 60 determines the operation reaction force based on two components, i.e., a steering-load-dependent component FS and an operation-force-dependent reduction component FA. The steering-load-dependent component FS is a component relating to the steering force (the steering torque of the steering motor 50) necessary for steering the wheels 10. The steering-load-dependent component FS is determined based on the steering current being supplied to the steering motor 50. Though not described in detail, it is recognized that the steering load of the wheels 10 increases with an increase in the steering current, and the steering-load-dependent component FS is determined to be a greater value. In this respect, the information relating to the steering current being actually supplied to the steering motor 50 is transmitted from the steering ECU 62 to the operation ECU 60 in the same system via the dedicated communication line 64.

The operation-force-dependent reduction component FA may be considered as a component for giving, to the vehicle driver, an operation feeling of what is called power steering system. In the power steering system, an assist torque corresponding to the operation torque is applied to the steering shaft 22. The operation ECU 60 detects the operation torque via the operation torque sensor 36. Based on the operation reaction force, the operation ECU 60 determines a reaction force current to be supplied to the reaction force motor 26 and supplies the determined reaction force current to the reaction force motor 26.

D. Detailed Configuration of Backup Power Source

Figure 3:
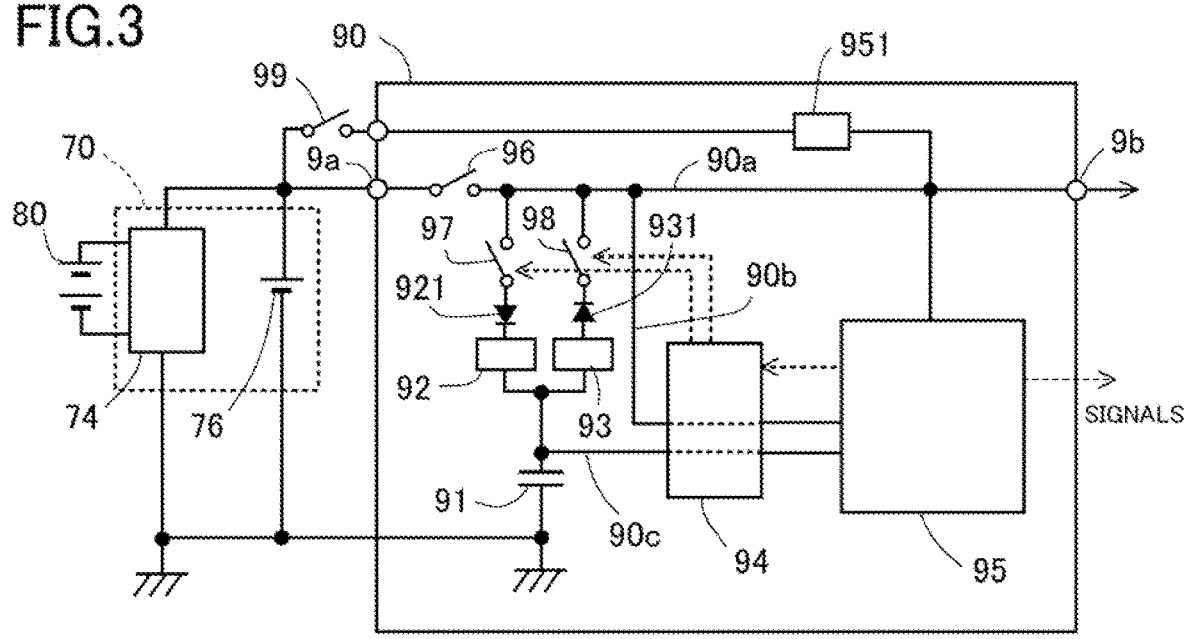
FIG. 3 is a schematic view illustrating a configuration of a backup power source in the steering system.

As illustrated in FIG. 3, the backup power source 90 includes a power source line 90a, the capacitor 91, a charging circuit 92, a discharging circuit 93, an interface circuit 94, a microcomputer 95, and switches 96, 97, 98. The power source line 90a connects an input terminal 9a and an output terminal 9b of the backup power source 90. The input terminal 9a is connected to a positive terminal of the main power source 70 while the output terminal 9b is connected to the operation device 12 (the operation ECU 60a) and the steering device 14 (the steering ECU 62a). The switch 96 is provided for the power source line 90a.

The capacitor 91 is parallely connected to the main power source 70 via the power source line 90a. The positive terminal of the main power source 70 is connected to one terminal of the capacitor 91 via the switches 96, 97 and the charging circuit 92. The positive terminal of the main power source 70 is connected to the one terminal of the capacitor 91 via the switches 96, 98 and the discharging circuit 93. The charging circuit 92 and the discharging circuit 93 are parallely connected.

The charging circuit 92 is for storing the electric power in the capacitor 91. When the switches 96, 97 are turned on and the switch 98 is turned off, the capacitor 91 starts to be charged with the electric power supplied from the main power source 70 via the power source line 90a, a diode 921 disposed between the power source line 90a and the charging circuit 92, and the charging circuit 92. The discharging circuit 93 is for discharging the electric power stored in the capacitor 91 and supplying the electric power to the operation device 12 and the steering device 14 when it becomes necessary to supply the electric power from the capacitor 91 in case of a failure of the main power source 70, for instance. When the switches 96, 97 are tuned off and the switch 98 is turned on, the electric power is supplied from the capacitor 91 to the operation device 12 and the steering device 14 via the discharging circuit 93, a diode 931 disposed between the power source line 90a and the discharging circuit 93, and the power source line 90a.

The interface circuit 94 is connected to the microcomputer 95. The interface circuit 94 has a function of level-converting the voltage of the main power source 70 (the power source line 90a) and the voltage of the capacitor 91 so as to output the voltages to the microcomputer 95 and a function of outputting control signals of the microcomputer 95 to the switches 96-98. In other words, the interface circuit 94 is for permitting the microcomputer 95 to monitor the voltages and for outputting the control signals of the microcomputer 95 to the switches 96-98.

The backup power source 90 further includes a first voltage detector (that may be referred to as a voltage detecting circuit or a voltmeter) 90b for detecting the voltage of the main power source 70 and a second voltage detector (that may be referred to as a voltage detecting circuit or a voltmeter) 90c for detecting the voltage of the capacitor 91. The first voltage detector 90b and the second voltage detector 90c may be regarded as including the interface circuit 94. The microcomputer 95 detects the voltage of the main power source 70 and the voltage of the capacitor 91 respectively via the first voltage detector 90b and the second voltage detector 90c. In this respect, the operation ECU 60 and the steering ECU 62 are configured to be capable of detecting the voltage of the main power source 70 not through the microcomputer 95 but through a different route. That is, each of the operation ECU 60 and the steering ECU 62 may be regarded as including a voltage detector for detecting the voltage of the main power source 70.

The microcomputer 95 includes a CPU, etc., and is utilized in control. The microcomputer 95 monitors the voltage of the main power source 70 and the voltage of the capacitor 91 and controls turning on and off of the switches 96-98 based on the voltage values. The microcomputer 95 is powered by the main power source 70 via a control-system power source circuit 951 provided separately from the power source line 90a. When an ignition switch (key switch) 99 is turned on, the control-system power source circuit 951 is connected to the main power source 70. The microcomputer 95 is communicably connected to the operation ECU 60 and/or the steering ECU 62. The description relating to FIG. 3 is made on the assumption that the microcomputer 95 is connected to the operation ECU 60a.

When the microcomputer 95 determines based on the voltage value of the capacitor 91 that the power storage amount of the capacitor 91 is insufficient, specifically, when the voltage value of the capacitor 91 is less than or equal to a predetermine value, for instance, the microcomputer 95 changes a control mode of the backup power source 90 from a normal mode to a charging mode. In the normal mode, the switch 96 is turned on and the switches 97, 98 are turned off. In the charging mode, the switches 96, 97 are turned on and the switch 98 is turned off.

When the microcomputer 95 determines based on the voltage value of the main power source 70 that the main power source 70 is in failure, namely, when the microcomputer 95 determines that the voltage value of the main power source 70 is less than a first threshold, the microcomputer 95 switches the control mode from the normal mode (or the charging mode) to a backup mode. In the backup mode, the switches 96, 97 are turned off and the switch 98 is turned on. The microcomputer 95 determines that the voltage value of the main power source 70 is less than the first threshold when the voltage value of the main power source 70 continues to be less than the first threshold for a predetermined threshold time. When the control mode is switched to the backup mode, the electric power is supplied from the capacitor 91 to the reaction force motor 26 and the steering motor 50 via respective drive circuits (inverters) of the operation ECU 60a and the steering ECU 62a.

When a failure (abnormality) of the capacitor 91 or the discharging circuit 93 is detected, the microcomputer 95 transmits, to the operation ECU 60a, information that the backup power source 90 is in failure. The failure of the capacitor 91 may be detected, for instance, based on the fact that the voltage of the capacitor 91 does not rise even though the control mode is the charging mode. Further, the failure of the discharging circuit 93 may be detected in initial checking at startup of the vehicle, for instance. In a case where the capacitor 91 or the discharging circuit 93 is in failure, the microcomputer 95 does not switch the control mode to the backup mode irrespective of the magnitude of the voltage value of the main power source 70.

In a case where the microcomputer 95 itself is in failure, the microcomputer 95 fails to transmit signals regularly to the operation ECU 60a, namely the microcomputer 95 fails to transmit periodic signals. In this case, the operation ECU 60a does not receive the signals from the microcomputer 95, and it can be determined that the backup power source 90 is in failure. Thus, the operation ECU 60a can detect that the backup power source 90 is in failure. When the backup power source 90 is abnormal, the operation ECU 60a transmits the information to the steering ECU 62, and the steering ECU 62 outputs a warning to the vehicle driver. For instance, the steering ECU 62 informs the vehicle driver of the abnormality and advises the vehicle driver to go to a dealer, by a voice message or a display.

E. Abnormal-Situation Control

When the microcomputer 95 switches the control mode to the backup mode in a state in which the backup power source 90 is normal, the steering ECU 62 and the operation ECU 60 execute the abnormal-situation control in response to the switching to the backup mode. The abnormal-situation control is executed for stopping the vehicle safely. For instance, the abnormal-situation control is a limp-home control that may also be referred to as an evacuation control. The reduction in the voltage of the main power source 70 is mostly due to a failure of the drive-system power source 80. In a case where the drive-system power source 80 is in failure, a drivable time for which the vehicle can continue to drive is limited. Thus, the limp-home control is a control in which a warning (such as a display of an alarm or a voice message) is output to the vehicle driver to encourage the vehicle driver to perform limp-home driving, for enabling the vehicle to be moved to and stopped at a safe place. Because the control mode is the backup mode, the steering control during the limp-home control is executed based on the power supply from the backup power source 90. In the limp-home control, the vehicle driver may be informed of a remaining drivable time.

Figure 4:
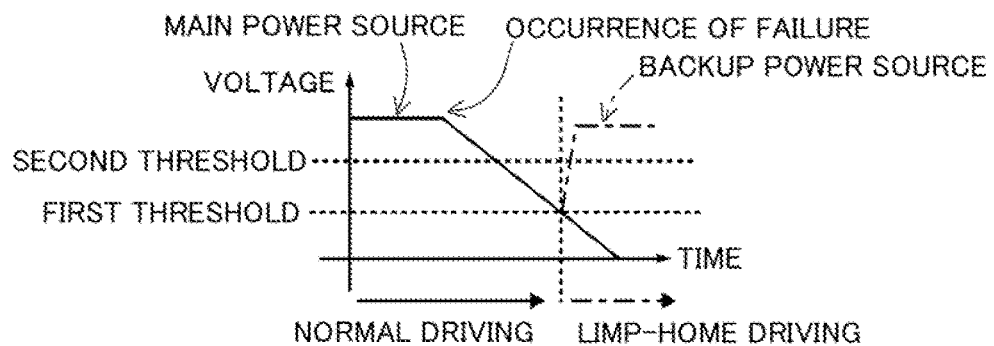
FIG. 4 is a time chart for explaining a change in voltage of a main power source and timing of starting a limp-home control in a normal state of the backup power source.

The first threshold is a threshold for determining a start of limp-home driving in a situation in which the backup power source 90 is normal. The first threshold is set to be a value obtained by allowing a margin for a reference that is based on voltages at which the operation device 12 and the steering device 14 fail to operate. In other words, the first threshold is set to be a value greater than the reference. As illustrated in FIG. 4, in a case where the voltage of the main power source 70 is lowered due to an occurrence of a failure of the main power source 70 in normal driving of the vehicle and the voltage of the main power source 70 is less than the first threshold for the predetermined threshold time, the microcomputer 95 switches the power supply source from the main power source 70 to the backup power source 90, and the steering ECU 62 and the operation ECU 60 start to execute the limp-home control. The predetermined threshold time is set for excluding noise, i.e., instantaneous drop of the voltage. The microcomputer 95 switches the control mode of the backup power source 90 to the backup mode, so that the electric power of the capacitor 91 is supplied to the operation device 12 and the steering device 14 via the power source line 90a.

Figure 5:
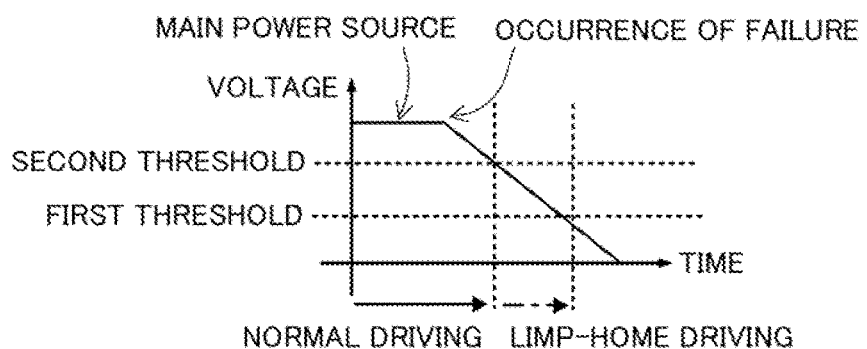
FIG. 5 is a time chart for explaining a change in voltage of the main power source and timing of starting the limp-home control in an abnormal state of the backup power source.

In a case where the steering ECU 62 and the operation ECU 60 detect an abnormality (failure) of the backup power source 90, the steering ECU 62 and the operation ECU 60 change the threshold, which is the voltage value of the main power source 70 as an index for determining the start of the limp-home control, from the first threshold to a second threshold. The second threshold is greater than the first threshold (the second threshold>the first threshold). As illustrated in FIG. 5, in a case where the voltage of the main power source 70 is lowered and is less than the second threshold for the predetermined threshold time, the steering ECU 62 and the operation ECU 60 determine that the voltage of the main power source 70 is less than the second threshold and execute the abnormal-situation control, namely, the limp-home control. With this configuration, the limp-home control is started earlier when the backup power source 90 is abnormal than when the backup power source 90 is normal, thus enabling the vehicle to perform limp-home driving for a longer length of time by the electric power of the main power source 70. That is, the operation device 12 and the steering device 14 are operated by the electric power of the main power source 70 before the voltage of the main power source 70 is lowered to a level at which the limp-home control is not executable, and the limp-home control can be started at timing that enables the limp-home control to be completed at intended timing. It may be considered that the microcomputer 95, the steering ECU 62, and the operation ECU 60 constitute a single controller of the steering system 1.

Figure 6:
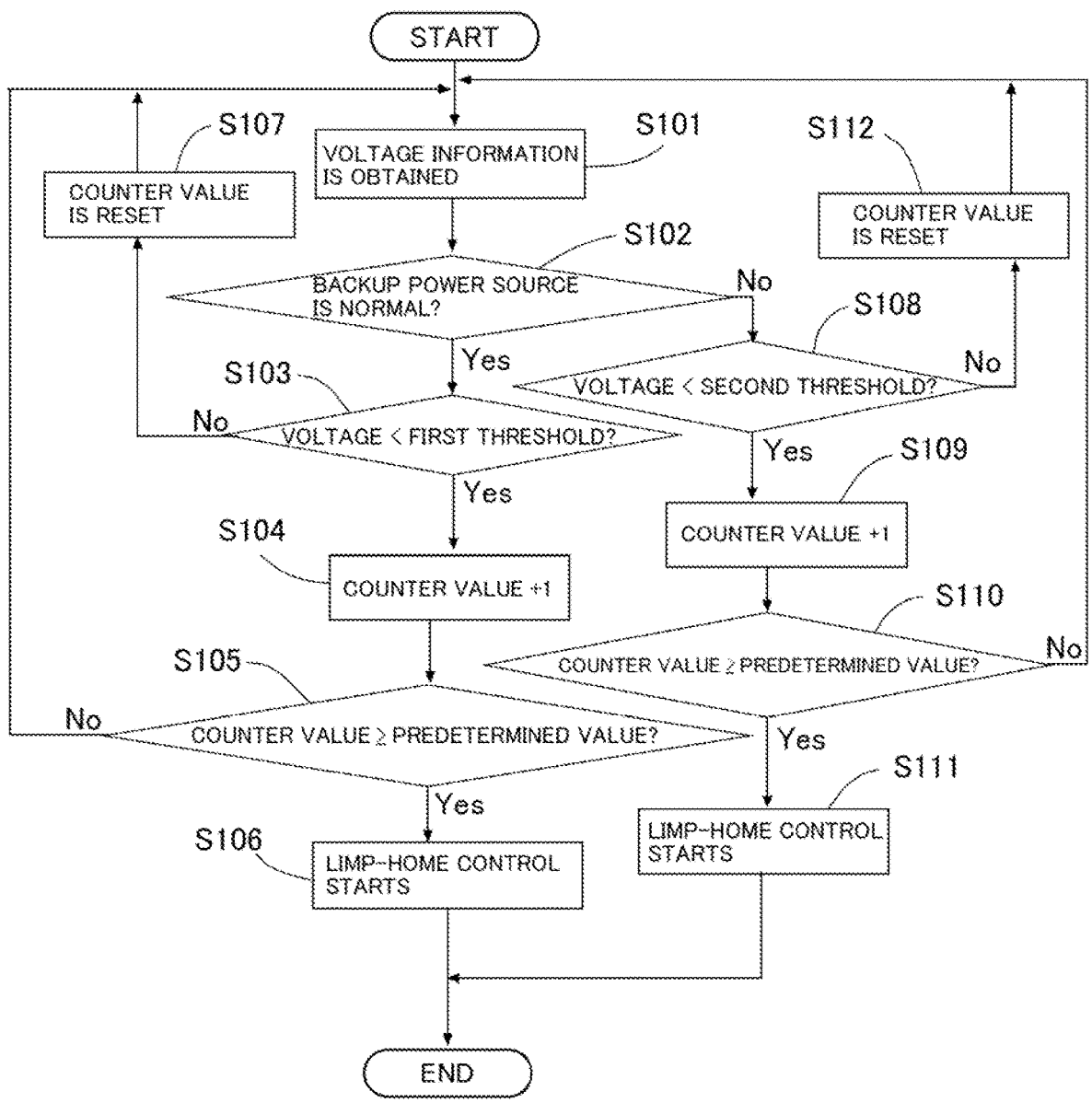
FIG. 6 is a flowchart illustrating a control flow in the embodiment.

Referring to FIG. 6, one example of a control flow will be described. Initially, the microcomputer 95, the steering ECU 62, and the operation ECU 60 obtain information on the voltage value of the main power source 70 (S101). The steering ECU 62 and the operation ECU 60 determine whether the backup power source 90 is normal based on results of communication with the microcomputer 95, namely, based on the presence or absence of a failure notification or based on the absence of signals, for instance (S102). When the backup power source 90 is normal (S102: Yes), the steering ECU 62 and the operation ECU 60 compare the voltage value of the main power source 70 to the first threshold (S103). When the voltage value of the main power source 70 is less than the first threshold (S103: Yes), the steering ECU 62 and the operation ECU 60 measure a length of time during which the voltage value of the main power source 70 is less than the first threshold (S104). Specifically, the steering ECU 62 and the operation ECU 60 increment a counter value by one (S104).

The steering ECU 62 and the operation ECU 60 then determine whether the counter value is not less than a predetermined value (S105). When the counter value is not less than the predetermined value (S105: Yes), the steering ECU 62 and the operation ECU 60 execute the limp-home control (S106). When the voltage value of the main power source 70 is not less than the first threshold (S103: No), the steering ECU 62 and the operation ECU 60 reset the counter value to 0 (S107). The microcomputer 95 compares the voltage of the main power source 70 to a backup-mode shifting threshold (that is identical with the first threshold in the present embodiment) as in Steps S103-S105 and Step S107, independently of the steering ECU 62 and the operation ECU 60. The backup-mode shifting threshold is a threshold for determining whether the control mode is shifted to the backup mode. That is, when the voltage of the main power source 70 continues to be less than the backup-mode shifting threshold for the predetermined threshold time (e.g., when the counter value is not less than the predetermined value), the microcomputer 95 shifts the control mode to the backup mode. In the present embodiment, the determination as to the start of the abnormal-situation control made by the ECUs 60, 62 and the determination as to the shifting to the backup mode made by the microcomputer 95 are executed independently of each other. In the present embodiment, the abnormal-situation control is started (S106) at the same time when the control mode is shifted to the backup mode.

When the backup power source 90 is abnormal, namely, when the backup power source 90 is in failure (S102: No), the steering ECU 62 and the operation ECU 60 compare the voltage value of the main power source 70 to the second threshold (the second threshold>the first threshold) (S108). When the voltage value of the main power source 70 is less than the second threshold (S108: Yes), the steering ECU 62 and the operation ECU 60 measure a length of time during which the voltage value of the main power source 70 is less than the second threshold (S109). Specifically, the steering ECU 62 and the operation ECU 60 increment the counter value by one (S109). The steering ECU 62 and the operation ECU 60 then determine whether the counter value is not less than the predetermined value (S110). When the counter value is not less than the predetermined value (S110: Yes), the steering ECU 62 and the operation ECU 60 execute the limp-home control (S111). When the voltage value of the main power source 70 is not less than the second threshold (S108: No), the steering ECU 62 and the operation ECU 60 reset the counter value to 0 (S112). The steering ECU 62 and the operation ECU 60 repeatedly execute the processing described above at a short time pitch.

In the steering system 1 constructed as described above, when the backup power source 90 is normal, the limp-home control that arises from the failure of the main power source 70 is started based on the first threshold and is executed based on the electric power of the backup power source 90. When the backup power source 90 is abnormal, the limp-home control that arises from the failure of the main power source 70 is started based on the second threshold and is executed based on the electric power of the main power source 70. It is noted that various determinations such as the determination as to the start of the abnormal-situation control may be performed by the steering ECU 62 and/or the operation ECU 60.

The steering system 1 according to the present embodiment is of a steer-by-wire type including: the main power source 70 and the backup power source 90; the steering device 14 including the steering motor 50 configured to be powered by at least one of the main power source 70 and the backup power source 90, in other words, by the main power source 70 and/or the backup power source 90, and configured to steer the wheels 10 by the force generated by the steering motor 50; the steering ECU 62 (as one example of the controller) configured to detect the voltage of the main power source 70, cause the main power source 70 to power the steering motor 50, and control the steering device 14 based on the steering request. When the backup power source 90 is normal, the steering ECU 62 executes the abnormal-situation control based on the electric power supplied to the steering motor 50 by at least one of the main power source 70 and the backup power source 90, in other words, by the main power source 70 and/or the backup power source 90 (specifically, by a selected one of the main power source 70 and the backup power source 90 in the embodiment illustrated above) when the steering ECU 62 determines that the voltage of the main power source 70 is less than the first threshold. When the backup power source 90 is abnormal, the steering ECU 62 executes the abnormal-situation control based on the electric power supplied to the steering motor 50 by the main power source 70 when the steering ECU 62 determines that the voltage of the main power source 70 is less than the second threshold that is greater than the first threshold.

In the thus constructed steering system 1, the second threshold is greater than the first threshold. Thus, timing of starting to execute the abnormal-situation control is earlier when the voltage of the main power source 70 is lowered in the situation in which the backup power source 90 is abnormal than when the voltage of the main power source 70 is lowered in the situation in which the backup power source 90 is normal. With this configuration, under circumstances where the backup power source 90 fails to supply the electric power, the abnormal-situation control can be started before the voltage of the main power source 70 is lowered to a level where the abnormal-situation control is not executable. In the present steering system 1, the abnormal-situation control can be started at earlier timing, namely, the abnormal-situation control can be started before the voltage of the main power source 70 is still high, so that a time for executing the abnormal-situation control is sufficiently ensured. Thus, the present steering system 1 enables the abnormal-situation control to be executed even if the main power source 70 becomes abnormal in the situation in which the backup power source 90 is abnormal.

The backup power source 90 includes: the capacitor 91; the first voltage detector 90b configured to detect the voltage of the main power source 70; the second voltage detector 90c configured to detect the voltage of the capacitor 91; and the microcomputer 95 configured to switch the power supply source, by which the steering motor 50 is powered, between the main power source 70 and the capacitor 91 based on the result of the detection by the first voltage detector 90b. The microcomputer 95 switches the power supply source from the main power source 70 to the backup power source 90 when the microcomputer 95 determines that the voltage of the main power source 70 is less than the backup-mode shifting threshold. In the present embodiment, the first threshold and the backup-mode shifting threshold are set to an identical value. Thus, the abnormal-situation control is executed based on the electric power of the backup power source 90.

The microcomputer 95 is configured to determine whether the backup power source 90 (the capacitor 91) is normal based on the control situation and the result of the detection by the second voltage detector 90c. For instance, in a case where the voltage of the capacitor 91 does not rise even though the control mode is the charging mode, the microcomputer 95 determines that the backup power source 90 is abnormal. The microcomputer 95 transmits the result of determination to the steering ECU 62. Further, the microcomputer 95 regularly or periodically transmits the signals to the steering ECU 62. The steering ECU 62 determines that the backup power source 90 is abnormal when the steering ECU 62 determines that reception of the signals form the microcomputer 95 is interrupted, namely, when the steering ECU 62 does not receive the signals from the microcomputer 95 for a predetermined length of time, for instance. Thus, the steering ECU 62, which functions as the controller, recognizes the abnormality of the backup power source 90.

Modifications

It is to be understood that the present disclosure may be embodied otherwise. For instance, the redundant structure of the power source is not limited to that illustrated above as long as the main power source 70 and/or the backup power source 90 powers the steering motor 50, specifically, as long as a selected one of the main power source 70 and the backup power source 90 powers the steering motor 50, for instance. The steering system 1 is applicable to automated driving vehicles, for instance. In this case, the steering request is output from an ECU, for instance. The abnormal-situation control is not limited to that illustrated above but may be various controls executed in case of an occurrence of an abnormality. The timing of switching the control mode to the backup mode and the timing of starting the abnormal-situation control need not necessary be identical. For instance, the abnormal-situation control may be started before or after the switching to the backup mode. In other words, the backup-mode shifting threshold and the first threshold may be mutually different values. The predetermined threshold time (i.e., the predetermined value for comparing to the counter value) may be different between in the determination as to the switching to the backup mode and in the determination as to the start of the abnormality-situation control. The steering system 1 may include a central ECU that functions as a central controller responsible for overall control of the two systems. The ECU/ECUs of the main system (the operation ECU 60a and/or the steering ECU 62a) may operate so as to be responsible for the two systems. The abnormal-situation control needs to be executed at least for a portion relating to steering (the steering ECU 62).

What is claimed is:

1. A steer-by-wire steering system, comprising:
a main power source and a backup power source;
a steering device including a steering motor configured to be powered by at least one of the main power source and the backup power source, the steering device being configured to steer at least one wheel by a force generated by the steering motor; and
a controller configured to detect a voltage of the main power source, cause the main power source to power the steering motor, and control the steering device based on a steering request,
wherein the controller is configured to:
determine whether the backup power source is normal or abnormal,
based upon a determination that the backup power source is normal, the controller executes an abnormal-situation control based on electric power supplied to the steering motor by at least one of the main power source and the backup power source when the controller determines that the voltage of the main power source is less than a first threshold, and
based upon a determination that the backup power source is abnormal, the controller changes the first threshold to a second threshold that is greater than the first threshold, and executes the abnormal-situation control based on electric power supplied to the steering motor by the main power source when the controller determines that the voltage of the main power source is less than the second threshold.

2. The steer-by-wire steering system according to claim 1, wherein the backup power source includes:
a capacitor;
a first voltmeter configured to detect the voltage of the main power source;
a second voltmeter configured to detect a voltage of the capacitor; and
a microcomputer configured to switch a power supply source, by which the steering motor is powered, between the main power source and the capacitor based on a result of the detection by the first voltmeter, and
wherein the microcomputer switches the power supply source from the main power source to the backup power source when the microcomputer determines that the voltage of the main power source is less than a backup-mode shifting threshold.

3. The steer-by-wire steering system according to claim 2, wherein the first threshold and the backup-mode shifting threshold are set to an identical value.

4. The steer-by-wire steering system according to claim 2, wherein the microcomputer is configured to determine whether the backup power source is normal based on a control situation and a result of the detection by the second voltmeter.

5. The steer-by-wire steering system according to claim 2, wherein the microcomputer regularly transmits signals to the controller, and
wherein the controller determines that the backup power source is abnormal when the controller determines that reception of the signals from the microcomputer is interrupted.

* * * * *